United States Patent
Heggemann et al.

(10) Patent No.: US 12,022,672 B2
(45) Date of Patent: *Jun. 25, 2024

(54) ELECTRONIC SEMICONDUCTING DEVICE, METHOD FOR PREPARING THE ELECTRONIC SEMICONDUCTING DEVICE AND COMPOUND

(71) Applicant: Novaled GmbH, Dresden (DE)

(72) Inventors: Ulrich Heggemann, Dresden (DE); Markus Hummert, Dresden (DE)

(73) Assignee: Novaled GmbH, Dresden (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/881,878

(22) Filed: Aug. 5, 2022

(65) Prior Publication Data

US 2022/0416188 A1     Dec. 29, 2022

Related U.S. Application Data

(63) Continuation of application No. 16/485,824, filed as application No. PCT/EP2018/053954 on Feb. 16, 2018, now Pat. No. 11,539,014.

(30) Foreign Application Priority Data

| Feb. 20, 2017 | (EP) | .................................... | 17156902 |
| Feb. 20, 2017 | (EP) | .................................... | 17156904 |
| Feb. 20, 2017 | (EP) | .................................... | 17156906 |

(51) Int. Cl.
*H01L 51/50*     (2006.01)
*C07F 3/02*     (2006.01)
(Continued)

(52) U.S. Cl.
CPC ............. *H10K 50/155* (2023.02); *C07F 3/02* (2013.01); *C07F 3/06* (2013.01); *C07F 5/022* (2013.01);
(Continued)

(58) Field of Classification Search
None
See application file for complete search history.

(56) References Cited

U.S. PATENT DOCUMENTS

| 5,247,226 A | 9/1993 | Sato et al. |
| 7,288,331 B2 | 10/2007 | Thompson et al. |

(Continued)

FOREIGN PATENT DOCUMENTS

| CN | 103492401 A | 1/2014 |
| CN | 104685647 A | 6/2015 |

(Continued)

OTHER PUBLICATIONS

Communication pursuant to Article 94(3) EPC issued in European application No. 18706500.8, dated Jan. 23, 2023, 7 pages.
(Continued)

*Primary Examiner* — Gregory D Clark
(74) *Attorney, Agent, or Firm* — Eversheds Sutherland (US) LLP

(57) ABSTRACT

The present invention relates to an electronic device comprising between a first electrode and a second electrode at least one first semiconducting layer comprising
(i) at least one first hole transport matrix compound consisting of covalently bound atoms and
(ii) at least one electrical p-dopant selected from metal borate complexes, wherein the metal borate complex consists of at least one metal cation and at least one anionic ligand consisting of at least six covalently bound atoms which comprises at least one boron atom, wherein the first semiconducting layer is a hole injection layer, a hole-injecting part of a charge generating layer or a hole transport layer, a method for preparing the same and a respective metal borate compound.

13 Claims, 1 Drawing Sheet

(51) Int. Cl.
    *C07F 3/06*     (2006.01)
    *C07F 5/02*     (2006.01)
    *C09K 11/06*     (2006.01)
    *H10K 50/155*     (2023.01)
    *H10K 50/17*     (2023.01)
    *H10K 59/35*     (2023.01)
    *H10K 71/00*     (2023.01)
    *H10K 71/30*     (2023.01)
    *H10K 85/30*     (2023.01)
    *H10K 85/60*     (2023.01)
    *H10K 30/30*     (2023.01)
    *H10K 50/11*     (2023.01)
    *H10K 50/16*     (2023.01)
    *H10K 50/165*     (2023.01)
    *H10K 50/18*     (2023.01)
    *H10K 71/16*     (2023.01)
    *H10K 102/10*     (2023.01)

(52) U.S. Cl.
    CPC ............ *C09K 11/06* (2013.01); *H10K 50/171* (2023.02); *H10K 59/35* (2023.02); *H10K 71/00* (2023.02); *H10K 71/30* (2023.02); *H10K 85/30* (2023.02); *H10K 85/322* (2023.02); *H10K 85/341* (2023.02); *H10K 85/381* (2023.02); *H10K 85/60* (2023.02); *H10K 85/622* (2023.02); *H10K 85/633* (2023.02); *H10K 85/636* (2023.02); *H10K 85/657* (2023.02); *H10K 85/6572* (2023.02); *C09K 2211/1018* (2013.01); *H10K 30/30* (2023.02); *H10K 50/11* (2023.02); *H10K 50/16* (2023.02); *H10K 50/165* (2023.02); *H10K 50/17* (2023.02); *H10K 50/18* (2023.02); *H10K 71/164* (2023.02); *H10K 85/615* (2023.02); *H10K 2102/103* (2023.02)

(56) References Cited

U.S. PATENT DOCUMENTS

| | | |
|---|---|---|
| 8,674,047 B2 | 3/2014 | Brown et al. |
| 8,835,022 B2 | 9/2014 | Hamada et al. |
| 9,006,716 B2 | 4/2015 | Hartmann et al. |
| 9,496,509 B2 | 11/2016 | Funyuu et al. |
| 9,515,277 B2 | 12/2016 | Okabe et al. |
| 9,583,714 B2 | 2/2017 | Funyuu et al. |
| 9,722,190 B2 | 8/2017 | Zeika et al. |
| 9,853,232 B2 | 12/2017 | Shin et al. |
| 10,050,089 B2 | 8/2018 | Lee et al. |
| 10,297,767 B2 | 5/2019 | Dorok et al. |
| 10,305,047 B2 | 5/2019 | Maltenberger et al. |
| 10,658,599 B2 | 5/2020 | Frey et al. |
| 2006/0279204 A1 | 12/2006 | Forrest et al. |
| 2009/0054232 A1 | 2/2009 | Dick et al. |
| 2011/0278559 A1* | 11/2011 | Brown .............. C08G 61/126 257/40 |
| 2012/0037907 A1 | 2/2012 | Whiting et al. |
| 2012/0074389 A1 | 3/2012 | Hamada et al. |
| 2013/0330632 A1 | 12/2013 | Burschka et al. |
| 2014/0264295 A1 | 9/2014 | Sim et al. |
| 2015/0162534 A1 | 6/2015 | Maltenberger et al. |
| 2016/0284883 A1 | 9/2016 | Feng et al. |
| 2017/0183543 A1 | 6/2017 | Nagata et al. |
| 2018/0051188 A1 | 2/2018 | Nagata et al. |
| 2019/0330485 A1 | 10/2019 | Endo et al. |
| 2020/0020860 A1 | 1/2020 | Nakaie et al. |
| 2020/0321657 A1 | 10/2020 | Burkhardt et al. |
| 2021/0202842 A1 | 7/2021 | Fadhel et al. |

FOREIGN PATENT DOCUMENTS

| | | |
|---|---|---|
| CN | 109494262 A | 3/2019 |
| EP | 0510541 A2 | 4/1992 |
| EP | 1209708 A1 | 5/2002 |
| EP | 2693506 A1 | 5/2014 |
| EP | 3002797 A1 | 4/2016 |
| EP | 3133663 A1 | 2/2017 |
| EP | 3133664 A1 | 2/2017 |
| EP | 3364475 A1 | 8/2018 |
| EP | 3364476 A1 | 8/2018 |
| EP | 3364477 A1 | 8/2018 |
| JP | 2001-131385 A | 5/2001 |
| JP | 2002513440 A | 5/2002 |
| JP | 2002203683 A | 7/2002 |
| JP | 2003031365 A | 1/2003 |
| JP | 4320484 B2 | 8/2009 |
| JP | 2009537676 A | 10/2009 |
| JP | 2010087276 A | 4/2010 |
| JP | 2011-228723 A | 11/2011 |
| JP | 2011227723 A | 11/2011 |
| JP | 2012516560 A | 7/2012 |
| JP | 2013526636 A | 6/2013 |
| JP | 2014524952 A | 9/2014 |
| JP | 2015504446 A | 2/2015 |
| JP | 2015506094 A | 2/2015 |
| JP | 2018093196 A | 6/2018 |
| JP | 2018525630 A | 9/2018 |
| KR | 20090024722 A | 3/2009 |
| KR | 1020110122693 A | 5/2013 |
| TW | 201700689 A | 1/2017 |
| WO | 2006087945 A1 | 8/2006 |
| WO | 2013/052096 A1 | 4/2013 |
| WO | 2014075300 A1 | 5/2014 |
| WO | 2017/014946 A1 | 1/2017 |
| WO | 2016063371 A1 | 4/2017 |
| WO | 2018135582 A1 | 7/2018 |

OTHER PUBLICATIONS

Garner, C. David et al., Molecular Structure of Tetrakis-p-trifluoroacetato-dimolybdenum(II), [Mo2 (02CCF3)4]; a Gas-phase Electron-diffraction Study, J.C.S.Dalton, Jan. 1, 1979, pp. 1279-1281.

Notice of Reasons for Refusal issued in Japan application No. 2019-545368, dated Sep. 28, 2021, 12 pages.

Decision to Grant a Patent issued in Japan application No. 2019-545368, dated May 10, 2022, 7 pages.

Romero, Nuria et al., Highly fluorinated hydrotris(indazolyl)borate calcium complexes: the structure and reactivity heavily depend on the ligand's electronic properties, Dalton Transactions, An International Journal for Inorganic, Organometallic and Bioinorganic Chemistry, Royal Society of Chemistry, Jul. 14, 2014, vol. 43, No. 26, pp. 10114-10119.

PCT International Search Report and Written Opinion for PCT Application No. PCT/EP2018/054160 dated May 29, 2018 (14 pages).

Pitula et al., "Synthesis, Structure, and Physico-Optical Properties at Manganate(II)-Based Ionic Liquids," Chem. Eur. J., 2010, 16:3355-3365.

PCT International Search Report and Written Opinion for PCT Application No. PCT/EP2018/054162 dated May 29, 2018 (9 pages).

Menke et al., "Highly Efficient p-Dopants in Amorphous Hosts," Organic Electronics, 2014, 15:365-371.

Xia et al., "High performance organic light-emitting diodes based on tetra(methoxy)-containing anthracene derivatives as a hole transport and electron-blocking layer", The Royal Society of Chemistry, 2010, 20, pp. 8382-8388.

PCT International Search Report and Written Opinion for PCT Application No. PCT/EP2018/053954 dated May 23, 2018 (9 pages).

Romero et al., "Highly Fluorinated Hydrotris(indazolyl)borate Calcium Complexes: The Structure and Reactivity Heavily Depend on the Ligand's Electronic Properties," Dalton Trans., 2014, 43:10114-10119.

PCT International Search Report and Written Opinion for PCT Application No. PCT/EP2018/054157 dated May 29, 2018 (11 pages).

(56) References Cited

OTHER PUBLICATIONS

Dong et al., "Highly Efficient Simplified Organic Light-Emitting Diodes Utilizing F4-TCNQ as an Anode Buffer Layer," Chin. Phys. Lett., 2010, 27(12):127802-1-127802-4.
PCT International Search Report and Written Opinion for PCT Application No. PCT/EP2018/054154 dated May 29, 2018 (12 pages).
European Office Action for EP Application No. 18706500.8 dated Jul. 22, 2021 (6 pages).
Japanese Office Action for JP Application No. 2019-544860 dated Jul. 6, 2021 (3 pages).
Taiwanese Office Action for TW Application No. 107105851 dated May 13, 2021 (8 pages, English translation).
Japanese Office Action for JP Application No. 2019-544860 dated Jul. 14, 2021 (5 pages).
Japanese Office Action for JP Application No. 2019-544861 dated Jul. 14, 2021 (6 pages).
Taiwan Office Action for TW Application No. 1102068610 dated Jul. 20, 2021 (8 pages).
Taiwan Search Report for TW Application No. 107105849 dated Jul. 20, 2021 (1 page).
Xia et al., "Influence of Doped Anions on Poly(3,4-ethylenedioxythiophene) as Hole Conductors for Iodine-Free Solid-State Dye-Sensitized Solar Cells," J. Am. Chem. Soc., 2008, 130:1258-1263.
Japanese Office Action for JP Application No. 2019-544850 dated Jul. 27, 2021 (5 pages).
Chinese Office Action for CN Application No. 201880012814.3 dated Aug. 17, 2021 (21 pages, English translation).
Chinese Office Action for CN Application No. 201880012559.2 dated Aug. 25, 2021 (17 pages, English translation).
Taiwan Office Action for TW Application No. 107105623 dated Sep. 1, 2021 (5 pages).
Taiwan Office Action for TW Application No. 107105848 dated Sep. 3, 2021 (7 pages).
Taiwan Office Action for TW Application No. 107105850 dated Sep. 16, 2021 (8 pages)(English translation).
Japanese Office Action for JP Application No. 2019545368 dated Sep. 28, 2021 (8 pages)(English translation).
Korean Office Action for KR Application No. 10-2019-7027314 dated Apr. 25, 2022, 10 pages.
Chinese Office Action for CN Application No. 201880013739 dated Oct. 13, 2021.
King et al., "Metal complexes of the perfluoroalkyl substituted ligand", Inorganica Chimica Acta, vol. 362, No. 12, Sep. 1, 2009, pp. 4493-4499.
Dias et al., "Synthesis and Chemistry of [Hydrotris(3,5-bis(trifluoromethyl)pyrazolyl)borato]silver(I) Complexes", Inorganic Chemistry, vol. 36, No. 27, Dec. 1, 1997, pp. 6205-6215.
Muñoz et al., "Perfluorinated 1H-indazoles and hydrotris(indazol-1-yl)borates. Supramolecular organization and a new synthetic procedure to form scorpionate ligands", New Journal of Chemistry, vil. 38, No. 6, Jan. 1, 2014, pp. 2451-2461.
Communication pursuant to Article 94(3) EPC, European application No. 17156906.4, dated Jul. 13, 2022, 18 pp.
Office Action, German Patent Application No. 11 2018 000 908.4, dated Jun. 8, 2022.
Chinese Office Action for CN Application No. 201880012552.0 dated Nov. 1, 2021 (English translation).
Zhang et al., "Non-amine-based furan-containing oligoaryls as efficient hole transporting materials", The Royal Society of Chemistry, 2002, pp. 2336-2337.
Notice to File a Response issued in Korea application No. 10-2019-7027280, dated Aug. 29, 2022, 11 pp.
Notice to File a Response issued in Korea application No. 10-2019-7027288, dated Aug. 29, 2022, 9 pp.
Notice to File a Response issued in Korea application No. 10-2019-7027323, dated Aug. 29, 2022, 10 pp.
Notice to File a Response issued in Korea application No. 10-2019-7027327, dated Aug. 29, 2022, 18 pp.
Office Action issued in corresponding Taiwan application No. 107105851, dated Jul. 18, 2022, 8 pp.
Pitula et al., Synthesis, Structure, and Physico-optical Properties of Manganate (II)-Based Ionic Liquids, Chem. Eur. J. 2010, 16, pp. 3355-3365, Mar. 8, 2010 (abstract only).
Office Action issued in corresponding Germany application No. 112018000907.6, dated Jun. 10, 2022, 9 pp.
Notice of Reasons for Refusal issued in Japan application No. 2022-178073, dated Oct. 31, 2023 (15 pages).
Notice of Reasons for Refusal issued in Japan application No. 2022-144426, dated Sep. 5, 2023, 9 pages.
Notice to File a Response issued in Korea application No. 10-2019-7027327, dated Sep. 6, 2023, 15 pages.

* cited by examiner

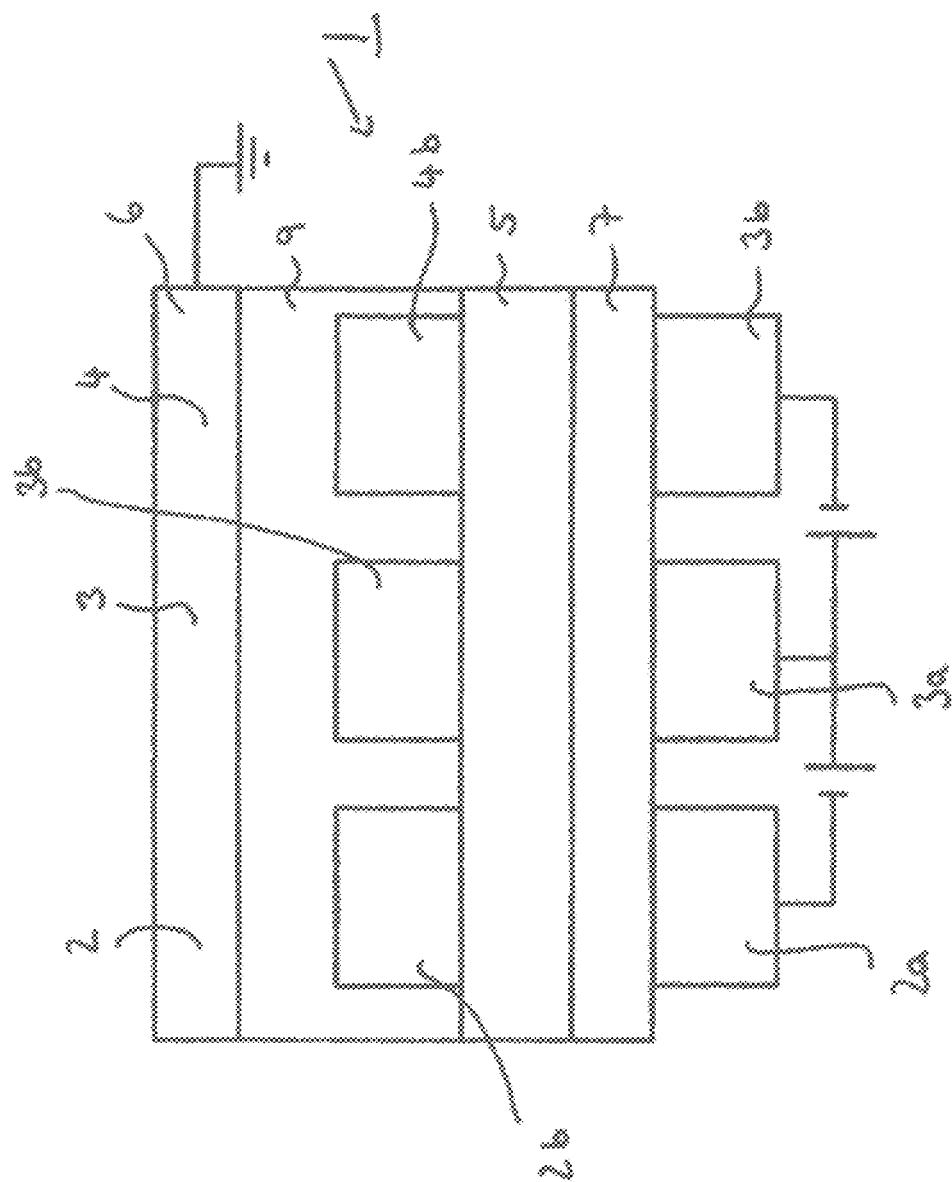

ELECTRONIC SEMICONDUCTING DEVICE, METHOD FOR PREPARING THE ELECTRONIC SEMICONDUCTING DEVICE AND COMPOUND

CROSS REFERENCE TO RELATED APPLICATIONS

This application is a continuation of U.S. patent application Ser. No. 16/485,824, filed Aug. 14, 2019, which is a U.S. national stage application of PCT/EP2018/053954, filed Feb. 16, 2018, which claims priority to European Patent Application Nos. 17156906.4, 17156902.3, and 17156904.9, which were filed Feb. 20, 2017. The content of these applications is incorporated herein by reference.

The disclosure relates to an electronic semiconducting device comprising a non-oxidizing p dopant in a hole injection and/or hole transport layer, to a method of preparing electronic semiconducting device and to a compound.

BACKGROUND

Broad spectrum of state-of-art electronic devices which already utilize organic semiconducting materials does often set very different requirements on a particular class of materials which have to fulfill an analogous function, e.g. hole injection and/or hole transport, in seemingly similar devices. As a more specific example, the definition of materials suitable for a hole transport layer may be significantly different e.g. if an OLED shall serve as a single, unstructured OLED for illumination, or as one pixel in a complex display device comprising a plurality of OLED pixels. From a chemical point of view, it may be quite uneasy to fulfill such various requirements with materials of one structural class. This fact results in a necessity to research and develop in parallel many structurally different material classes; a commercial success is under such circumstances not only economically but also technically and scientifically challenging task. Accordingly, any material class possessing high versatility in a broad spectrum of various specific applications may become an invaluable asset.

In some cases, contradictory requirements put on the material having certain function may appear even for material comprised in one and the same device. A typical example can be an active matrix OLED display (AMOLED). In active OLED displays, comprising a plurality of OLED pixels sharing a common hole transport layer, challenging requirements are put on semiconducting materials used in layers arranged between the anode and the emitting layer and shared by the plurality of pixels. On one hand, the materials shall enable individual driving of individual pixels at operational voltages which are as low as possible. On the other hand, so called electrical crosstalk between neighbour pixels should be avoided. The application WO2016/050834 which is herein incorporated by the reference teaches that these contradictory requirements can be fulfilled by p-doped layers having electrical conductivity in the range $1\times10^{-3}$ $S \cdot m^{-1}$ and $1\times10^{-8}$ $S \cdot m^{-1}$, most favourably between $1\times10^{-5}$ $S \cdot m^{-1}$ and $1\times10^{-6}$ $S \cdot m^{-1}$. Such low-conductivity p-doped hole transport layers are achievable by use of usual state-of-art redox dopants, like strongly electron accepting radialene compounds, in matrices which are poorly dopable in terms of their deep HOMO level. There is, however, continuing demand for p-dopants fulfilling these criteria and improved in other parameters, e.g. from the viewpoint of processability and device stability.

WO 2013/052096 A1 discloses doping method for hole injection and transport layers and use thereof in organic electronic devices, such as OLEDs.

Nuria et al. *Dalton Transactions,* 2014, 43, 10114-10119 discloses highly fluorinated hydrotris(indazolyl)borate calcium complexes and reports the structure and reactivity thereof.

SUMMARY

It is an object to provide broad variety of state-of-art electronic devices comprising electrically p-doped hole injection and/or hole transport layers, based on one broad class of p-dopants.

Another object is to provide, within the broad class of p-dopants, particular compounds having high versatility of their use in devices. The variety of devices shall include simple devices as well as improved active OLED displays. In one aspect, the performance of simple devices comprising new p-dopants shall be fully comparable with analogous simple devices comprising state-of-art p-dopants, or better. In another aspect, the new p-dopants shall overcome some drawbacks of state-of-art dopants in complex devices such as AMOLED displays. In one aspect, electrical crosstalk between neighbor pixels of the active OLED display shall be reduced. In another aspect, a high performance in simple devices as well as in individual OLED pixels of a complex display device shall be enabled. In another aspect, the improved materials should enable robust device manufacturing, e.g. in terms of improved device stability during any processing step which comprises a treatment of the device or its particular layer at an elevated temperature.

The object is achieved through an electronic device comprising between a first electrode and a second electrode at least one first hole transport layer, wherein the first hole transport layer comprises
 (i) at least one first hole transport matrix compound consisting of covalently bound atoms and
 (ii) at least one electrical p-dopant selected from metal borate complexes, wherein the metal borate complex consists of at least one metal cation and at least one anionic ligand consisting of at least six covalently bound atoms which comprises at least one boron atom, wherein the first semiconducting layer is a hole injection layer, a hole-injecting part of a charge generating layer or a hole transport layer.

In one embodiment it may be provided that, in the metal borate complexes, it is excluded that the metal is silver (Ag).

In one embodiment, the electronic device further comprises at least one light emitting layer or at least one light absorbing layer between the first electrode and the second electrode, wherein the first electrode is an anode and the first semiconducting layer is arranged between the anode and the light emitting layer or between the anode and the light absorbing layer.

In one embodiment, the first semiconducting layer is adjacent to the anode.

In one embodiment, the anionic ligand consists of at least 7, preferably at least 8, more preferably at least 9, even more preferably at least 10, even more preferably at least 11, most preferably at least 12 covalently bound atoms.

Under covalent bond, it is to be understood any bonding interaction which involves electron density sharing between the two assessed atoms, wherein the bonding is stronger than van der Waals dispersive interactions; for the sake of simplicity, binding energy 10 kJ/mol may be taken as an arbitrary lower limit. In this sense, the term includes also coordination bonds or hydrogen bonds. Anions and/or anionic ligands comprising hydrogen bonds, however, are not particularly preferred.

In one embodiment, the anionic ligand comprises at least one electron withdrawing group selected from halogenated alkyl, halogenated (hetero)aryl, halogenated (hetero)arylalkyl, halogenated alkylsulfonyl, halogenated (hetero)arylsulfonyl, halogenated (hetero)arylalkylsulfonyl, cyano. It is to be understood that for the sake of brevity, halogenated (hetero)aryl means "halogenated aryl or halogenated heteroaryl", halogenated (hetero)arylalkyl means "halogenated heteroarylalkyl or halogenated arylalkyl", halogenated (hetero)arylsulfonyl means "halogenated heteroarylsulfonyl or halogenated arylsulfonyl" and halogenated (hetero)arylalkylsulfonyl means "halogenated heteroarylalkylsulfonyl or halogenated arylalkylsulfonyl".

In one embodiment, the electron withdrawing group is a perhalogenated group. It is to be understood that the term "halogenated" means that at least one hydrogen atom of a group comprising peripheral or inner hydrogen atoms is replaced with an atom selected from F, Cl, Br and I. It is further understood that in a perhalogenated group, all hydrogen atoms comprised in the unsubstituted group are replaced with atoms independently selected from F, Cl, Br and I. Accordingly, under perfluorinated group, it is to be understood a perhalogenated group, wherein all halogen atoms replacing hydrogen atoms are fluorine atoms.

In one embodiment, the metal borate complex comprised in the electronic device has formula (I)

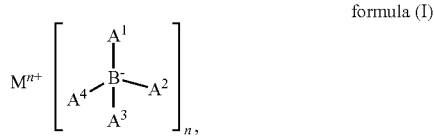

formula (I)

wherein M is a metal ion, each of $A^1$-$A^4$ is independently selected from
(i) H,
(ii) F,
(iii) CN,
(iv) $C_6$-$C_{60}$ aryl,
(v) $C_7$-$C_{60}$ arylalkyl,
(vi) $C_1$-$C_{60}$ alkyl,
(vii) $C_2$-$C_{60}$ alkenyl,
(viii) $C_2$-$C_{60}$ alkynyl,
(ix) $C_3$-$C_{60}$ cycloalkyl and
(x) $C_2$-$C_{60}$ heteroaryl;
wherein, with proviso that the overall count of carbon atoms in a carbon-containing group will not exceed 60, any hydrogen atom in any carbon containing group selected from (iv), (v), (vi), (vii), (viii), (ix) and (x) may be replaced with a substituent independently selected from F, Cl, Br, I, CN, unsubstituted or halogenated alkyl, unsubstituted or halogenated (hetero)aryl, unsubstituted or halogenated (hetero)arylalkyl, unsubstituted or halogenated alkylsulfonyl, unsubstituted or halogenated (hetero)arylsulfonyl, unsubstituted or halogenated (hetero)arylalkylsulfonyl, unsubstituted or halogenated boron-containing hydrocarbyl, unsubstituted or halogenated silicon-containing hydrocarbyl;
n is valence of the metal ion; and
at least one of $A^1$-$A^4$ is F, CN, or an electron-withdrawing carbon group, wherein the electron-withdrawing carbon group is a carbon group selected from hydrocarbyl, boron-containing hydrocarbyl, silicon-containing hydrocarbyl and heteroaryl and having at least one half of its hydrogen atoms replaced with F, Cl, Br, I and/or CN.

In one embodiment, M is selected from alkali metals, alkaline earth metals, rare earth metals, transition metals, alternatively from the transitions metals except Ag, Al, Ga, In, Tl, Sn, Pb, Bi or mixtures thereof and n is 1, 2 or 3; preferably, M is selected from Li, Na, K, Rb, Cs, Cu, or mixtures thereof and n is 1; also preferably, M is selected from Be, Mg, Ca, Sr, Ba, Mn, Fe, Co, Ni, Cu, Zn, Cd or mixtures thereof and n is 2; more preferably, M is selected from Li, Na, Cu, or mixtures thereof and n is 1; also more preferably, M is selected from Mg, Ca, Mn, Zn, Cu or mixtures thereof and n is 2; most preferably, M is Li and n is 1 or M is selected from Mg, Mn, Zn or mixtures thereof and n is 2.

In one embodiment, in the p-dopant molecule, the atom of the anion and/or of the anionic ligand which is closest to the metal cation is a C or a N atom.

In one embodiment, the acidity of the electrically neutral conjugated acid formed from the an ion and/or anionic ligand by addition of one or more protons in 1,2-dichloroethane is higher than that of HCl, preferably higher than that of HBr, more preferably higher than that of HI, even more preferably higher than that of fluorosulfuric acid, and most preferably higher than that of perchloric acid.

In one embodiment, the electrical p-dopant has energy level of its highest unoccupied molecular orbital computed by standard quantum chemical method and expressed in absolute vacuum scale at least 0.5 eV, preferably at least 0.6 eV, more preferably at least 0.8 eV, even more preferably at least 1.0 eV, most preferably at least 1.2 eV above the energy level of the highest occupied orbital of the covalent hole transport compound computed by the standard quantum chemical method.

The standard quantum chemical method may be the software package TURBOMOLE using DFT functional B3LYP with the basis set def2-TZVP.

In one embodiment, the first hole transport matrix compound has an energy level of its highest occupied molecular orbital computed by standard quantum chemical method and expressed in absolute vacuum scale more negative than −3.0 eV, preferably more negative than −3.5 eV, more preferably more negative than −4.0 eV, even more preferably more negative than −4.5 eV and most preferably more negative than −5.0 eV.

In one embodiment, the first hole transport matrix compound is an organic compound, preferably an organic compound comprising a conjugated system of at least 6, more preferably at least 10 delocalized electrons; also preferably, the first hole transport matrix compound comprises at least one triaryl amine structural moiety, more preferably, the first hole transport matrix compound comprises at least two triaryl amine structural moieties.

In one embodiment, the p-dopant and the first hole transport matrix compound form two adjacent sub-layers in the first semiconducting layer.

In one embodiment, all layers between the first and second electrode as well as the electrode deposited on top of the last organic layer are preparable by vacuum deposition at a pressure below $1\times10^{-3}$ Pa, preferably at a pressure below $5\times10^{-4}$ Pa, more preferably at a pressure below $1\times10^{-4}$ Pa.

The object is further achieved by method for preparing the display device according to any of the preceding embodiments, the method comprising at least one step wherein the hole transport matrix compound and the electrical p-dopant are in mutual contact exposed to a temperature above 50° C.

It is to be understood that "in mutual contact" does mean the presence of both components in a condensed phase, or their presence in two condensed phases which share a common phase interface.

In one embodiment, the method may comprise the steps, wherein
(i) the p-dopant and the first hole transport matrix compound are dispersed in a solvent,
(ii) the dispersion is deposited on a substrate and
(iii) the solvent is evaporated at an elevated temperature.

The method may further comprise at least one step wherein the p-dopant is evaporated at a reduced pressure, preferably at a pressure below $1 \times 10^{-2}$ Pa and at a temperature above 50° C., more preferably at a pressure below $5 \times 10^{-2}$ Pa and at a temperature above 80° C., even more preferably at a pressure below $1 \times 10^{-3}$ Pa and at a temperature above 120° C., most preferably at a pressure below $5 \times 10^{-4}$ Pa and at a temperature above 150° C.

In one embodiment, the p-dopant may be used in form of a solid hydrate.

In another embodiment, the p-dopant may be used as an anhydrous solid comprising less than 0.10 wt % water, preferably less than 0.05 wt % water.

The object is further achieved by compound having formula (Ia)

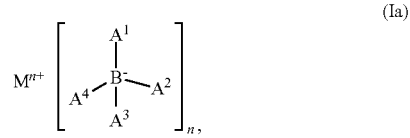

(Ia)

wherein $A^1$ is H, $A^2$-$A^4$ are independently selected from perfluorinated indazolyl having formula IIa or IIb

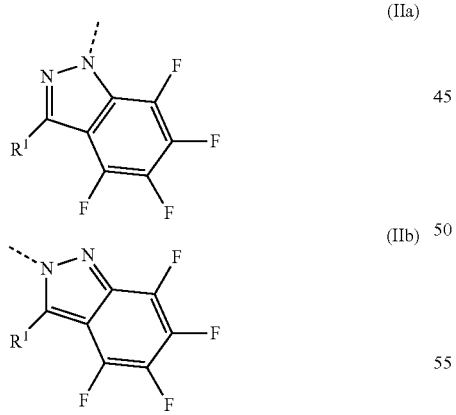

(IIa)

(IIb)

wherein the dashed bond does represent the attachment to the boron atom in formula (Ia) and $R^1$ is a perfluorinated $C_1$-$C_{20}$ hydrocarbyl group;
M is Li and n is 1, or
M is a divalent metal and n is 2.

In one embodiment, the compound having formula (Ia) is a solid compound.

In one embodiment, the compounds wherein M is calcium and $R^1$ is trifluormethyl may be excluded.

In one embodiment, the divalent metal M in formula (Ia) is selected from Mg, Mn and Zn and n is 2.

The object is further achieved by compound having formula (Iaa)

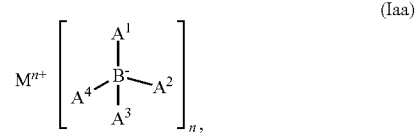

(Iaa)

wherein $A^1$ is H, $A^2$-$A^4$ are independently selected from perfluorinated indazolyl having formula IIa or IIb

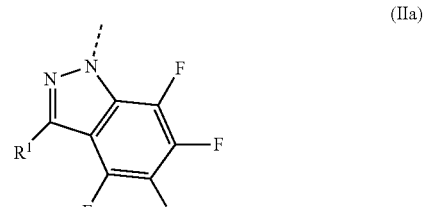

(IIa)

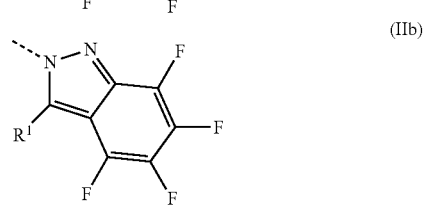

(IIb)

wherein the dashed bond does represent the attachment to the boron atom in formula (Ia) and $R^1$ is a perfluorinated $C_1$-$C_{20}$ hydrocarbyl group;
M is Li and n is 1, or
M is a divalent metal selected from Mg, Mn and Zn and n is 2.

The object is further achieved by compound having formula (Ib)

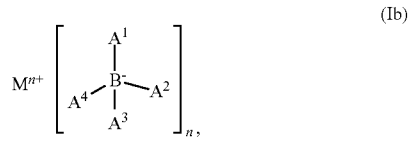

(Ib)

wherein $A^1$ is H, $A^2$-$A^4$ are independently selected from fluorinated pyrazolyl having formula III

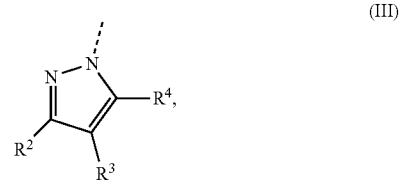

(III)

wherein the dashed bond does represent the attachment to the boron atom in formula (Ib), $R^2$ and $R^4$ are independently selected from a perfluorinated $C_1$-$C_{20}$ hydrocarbyl group, R³ is selected from H, F, CN and from a perfluorinated $C_1$-$C_{20}$ hydrocarbyl group;

M is Li and n is 1, or

M is a divalent metal and n is 2.

In one embodiment, R² and/or R⁴ in formula (Ib) are trifluormethyl.

In one embodiment, the divalent metal M in formula (Ib) is selected from Mg, Mn and Zn and n is 2.

Effect of the Invention

An important property of materials comprised in organic semi-conducting devices is their conductivity. In a display device having a structured anode and at least two pixels sharing at least one hole transport and/or hole injection layer, as described in WO2016/050834, a limited conductivity of the shared layer may be favourable for achieving a low level of the undesired electrical crosstalk in the display. On the other hand, very low conductivity of the shared layer may increase the operational voltage of the display. WO2016/050834 teaches a conductivity range which represents a trade-off between these contradictory requirements.

The authors of the present application, however, surprisingly found that electrical p-dopants based on certain metal salts and metal complexes enable, under certain conditions, preparing p-doped materials and/or p-doped layers providing stable hole injection from state-of-art anodes into state-of-art hole transport matrices, without substantially increasing the concentration of the free charge carriers above the level which corresponds to conductivities observed in a neat matrix.

This surprising finding offered an opportunity to build the displays of WO2016/050834, operating at fully comparable voltages, even though the hole transport and/or hole injection layers shared by the multiplicity of pixels have conductivities below the optimum range between $1\times10^{-5}$ S·m⁻¹ and $1\times10^{-6}$ S·m⁻¹ as disclosed in WO2016/050834. The dopants of the present application enable efficient operation of display devices of WO2016/050834 at the level of electrical conductivity in p-doped layers shared by the multiplicity of pixels which is near to the detection limit of the available measuring procedure or below it. Thus, the dopants of the present application enable further suppressing the electrical crosstalk in OLED displays and offer new opportunities for designing efficient OLED displays exhibiting very low level of electrical cross talk. These observations made by the authors will be further described in more detail.

In a previous application EP15181385 filed by the applicant, some of the authors described successful use of some metal amides like

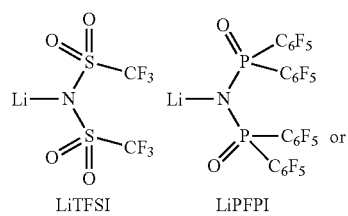

LiTFSI   LiPFPI

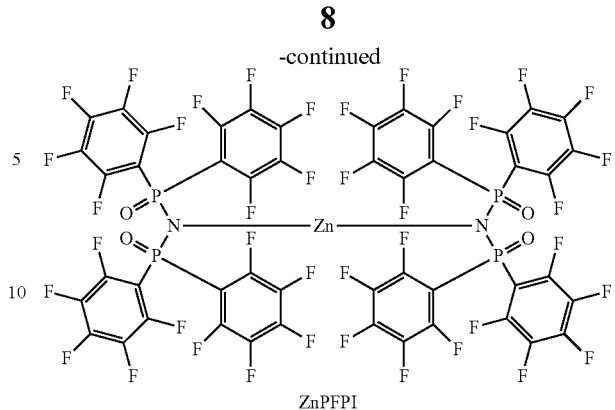

ZnPFPI as hole injection materials in organic electronic devices.

Parallel with further investigation of analogous metal amide compounds, the authors surprisingly found that also some structurally quite different compounds, namely metal borate complexes like

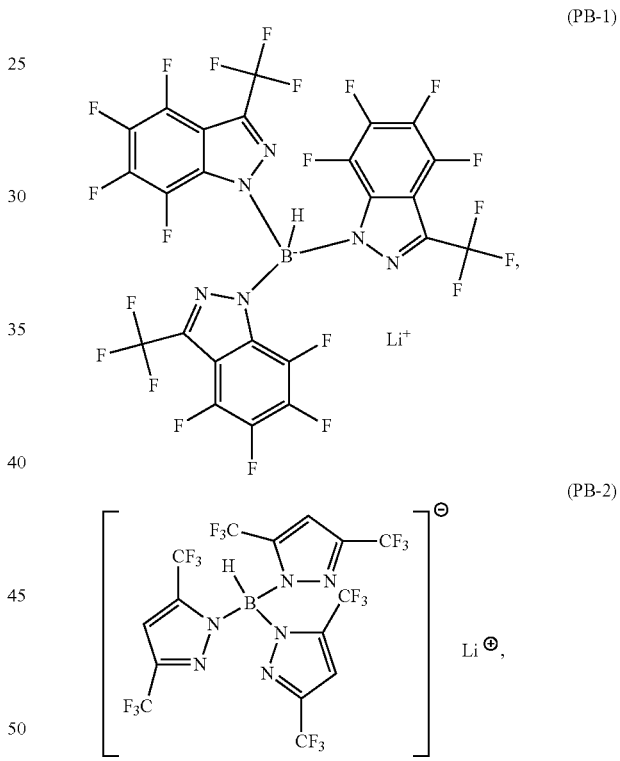

are utilizable in an analogous way.

Most surprisingly, the authors found that all these structurally different compounds analogously exhibit two different modes in their p-doping activity, depending on the process conditions during preparation of the doped material and/or layer.

In the first mode, semiconducting materials and/or layers doped with these compounds (which can be generalized as metal salts and/or electrically neutral metal complexes with an anionic ligand) exhibit well-measurable electrical conductivities which are only slightly lower in comparison with materials and/or layers doped with typical redox p-dopants. It appears that this mode occurs if the doped material and/or layer is exposed to oxygen, even though only in trace amounts.

In the second mode, the semiconducting materials and/or layers doped with the disclosed metal salts and/or electrically neutral metal complexes comprising an anionic ligand exhibit hardly measurable electrical conductivities. This mode occurs if the oxygen access to the doped material and/or layer is strictly avoided throughout processing thereof. The authors found that despite the extremely low conductivity of materials and/or layers doped in the second mode, devices comprising such materials and/or layers particularly as hole transporting or hole injecting layers still exhibit electrical behavior corresponding to an excellent hole injection.

The existence of the two above described modes of p-doping activity provides the disclosed p-dopants with a unique versatility in their use in organic electronic devices, and particularly in displays comprising an anode structured into a multiplicity of pixels sharing a common hole transport layer. The conductivity of the common p-doped layer can be either set in the limits taught in WO2016/050834 by exploiting the first doping mode, or set below these limits, exploiting the second doping mode.

Furthermore, recent investigations made by the authors provided hints that the materials and/or layers doped with the presented metal salts and/or metal complexes may exhibit a favourable thermal stability, particularly in materials provided according to the above described second mode of the p-doping action. These properties may be again particularly suitable for the use of the disclosed p-dopants in AMOLED displays, because the necessity of structuring such displays into separate pixels often requires a thermal treatment of p-doped layers or using another treatment which may result in an unavoidable heating of a previously deposited p-doped layer.

In a specific embodiment of the invention, the authors provided new borate compounds comprising specific heterocyclic ligands wherein at least one half of hydrogen atoms is substituted with electron withdrawing groups like halogen atoms or nitrile groups. Besides p-doping activity fully comparable with metal salts and/or anionic metal complexes of EP15181385, the borate complexes are substantially non-hygroscopic and remain solid even at high air humidity, whereas LiTFSI and analogous TFSI salts have a tendency to deliquesce.

DETAILED DESCRIPTION

The electrical conductivity of a thin layer sample can be measured by, for example, the so called two-point method. At this, a voltage is applied to the thin layer and the current flowing through the layer is measured. The resistance, respectively the electrical conductivity, results by considering the geometry of the contacts and the thickness of the layer of the sample. The experimental setup for conductivity measurement used by the authors of the present application enables deposition of p-doped layers as well as conductivity measurement under controlled conditions, especially with regard to the contact of deposited layers with an atmosphere comprising oxygen. In this regard, the whole deposition-measurement sequence may be carried out either in a glove-box or in a chamber comprising a controlled atmosphere, using solution processing techniques, or completely in a vacuum chamber, using vacuum thermal evaporation (VTE) as the method of choice which may be especially suitable in case that materials and/or layers doped in the second mode are required.

In one embodiment, the electronic device may be an AMOLED display comprising a plurality of pixels comprising at least two pixels, wherein the first hole transport layer comprising the p-dopant is arranged between a structured anode and a structured light emitting layer. In this embodiment, the first hole transport layer is shared by the plurality of pixels, and in this case, it may be advantageous for limiting electrical crosstalk between individual pixels operated at different voltages that the electrical conductivity of the shared layer is as low as possible.

In this case, the conductivity of the first hole transport layer may be lower than $1\times10^{-6}$ S·m$^{-1}$, preferably lower than $1\times10^{-7}$ S·m$^{-1}$, more preferably lower than $1\times10^{-8}$ S·m$^{-1}$. Alternatively, provided that the detection limit of the used conductivity measurement method is lower than $1\times10^{-6}$ S·m$^{-1}$, it is preferred that in this embodiment of the electronic device, the conductivity of the first hole transport layer is lower than the detection limit.

In the AMOLED display, the cathode may be formed as a common cathode for the plurality of pixels. The common cathode may extend over all pixels of the plurality of pixels in the OLED display. Oppositely, every individual pixel may have its own anode that may not touch anodes of other individual pixels.

Optionally, for one or more of the plurality of OLED pixels, following organic layers may be provided: a hole blocking layer, an electron injection layer, and/or an electron blocking layer.

Further, the AMOLED display has driving circuit configured to separately drive the individual pixels of the plurality of pixels provided in the OLED display. In one embodiment, a step of separately driving may comprise separate control of the driving current applied the individual pixels.

The first HTL is made of a hole transport matrix (HTM) material electrically doped with the p-dopant. The hole transport matrix material may be electrically doped with more than one p-dopant. It is to be understood that the HTM material may consist of one or more HTM compounds, whereas the term hole transport material is a broader term used throughout this application for all semiconducting materials comprising at least one hole transport matrix compound. The hole transport matrix material is not particularly limited. Generally, it is any material consisting of covalently bound atoms which allows embedding the p-dopant. In this sense, infinite inorganic crystals having predominantly covalent bonds like silicon or germanium, or extremely crosslinked inorganic glasses like silicate glass, do not fall in the scope of the definition of the hole transport matrix material. Preferably, the hole transport matrix material may consist of one or more organic compounds.

In the electronic device, the first hole transport layer may have a thickness of less than 150 nm, less than 100 nm, less than 50 nm, less than 40 nm, less than 30 nm, less than 20 nm, or less than 15 nm.

The first hole transport layer may have a thickness of more than 3 nm, more than 5 nm, more than 8 nm, or more than 10 nm.

The anode may be made of a transparent conductive oxide (TCO), like indium tin oxide (ITO) or aluminium zinc oxide (AZO). Alternatively, the anode may be made of one or more thin metallic layers leading to a semitransparent anode. In another embodiment, the anode may be made of a thick metallic layer which is not transparent to visible light.

The electronic device may comprise an electron blocking layer (EBL) provided between the first hole transport layer and the light emitting layer. The EBL may be in direct contact with the first HTL and the EML. The electron blocking layer may be an electrically undoped layer (in other words, it may be free of an electrical dopant) made of an organic hole transport matrix material. The composition of the organic hole transport matrix material of the first hole transport layer may be the same as the composition of the organic hole transport matrix material of the electron blocking layer. In another embodiment of the invention, the composition of both hole transport matrix materials may be different.

The EBL may have a layer thickness of more than 30 nm, more than 50 nm, more than 70 nm, more than 100 nm, or more than 110 nm.

The thickness of the EBL may be less than 200 nm, less than 170 nm, less than 140 nm, or less than 130 nm. Compared to the EBL, the common HTL may be thinner by about one order of magnitude.

Each compound forming the electron blocking layer may have a highest occupied molecular orbital (HOMO) energy level, expressed in the absolute scale referring to vacuum energy level being zero, higher than a HOMO level of any compound forming the hole transport matrix material of the common hole transport layer.

The organic matrix material of the electron blocking layer may have a hole mobility which is equal to or higher than the hole mobility of the matrix material of the hole transport layer.

The hole transport matrix (HTM) material of the common HTL and/or of the EBL may be selected from compounds comprising a conjugated system of delocalized electrons, the conjugated system comprising lone electron pairs of at least two tertiary amine nitrogen atoms.

Suitable compounds for the hole transport matrix material of the doped hole transport layer and/or the common hole transport layer may be selected from the known hole transport matrices (HTMs), e.g. from triaryl amine compounds. HTMs for the doped hole transport material may be compounds comprising a conjugated system of delocalized electrons, wherein the conjugated system comprises lone electron pairs of at least two tertiary amine nitrogen atoms. Examples are N4,N4'-di(naphthalen-1-yl)-N4,N4'-diphenyl-[1,1'-biphenyl]-4,4'-diamine (HT1), and N4,N4, N4",N4"-tetra([1,1'-biphenyl]-4-yl)-[1,1':4',1"-terphenyl]-4,4"-diamine (HT4). The synthesis of terphenyldiamine HTMs is described e.g. in WO 2011/134458 A1, US 2012/223296 A1 or WO 2013/135237 A1; 1,3-phenylenediamine matrices are described e.g. in WO 2014/060526 A1. These documents are herein incorporated by reference. Many triaryl amine HTMs are commercially available.

The electronic device may further comprise a light absorbing layer arranged between the first and second electrode, e.g. in a solar cell. In another embodiment, the electronic device may be an electroluminescent device, comprising between the first and second electrode at least one light emitting layer.

The light emitting layer of the electroluminescent device may be continuous, or structured. Example of an electroluminescent device which comprises a structured light emitting layer may be the AMOLED display which may comprise a plurality of sub-regions, each of the sub-regions being assigned to one of the pixels from the plurality of pixels. The light emitting layer of an individual pixel, corresponding to a sub-region of the emitting layer of the display, preferably does not touch light emitting layers of neighbor pixels. In the display manufacturing process, the organic layer comprising EMLs of individual pixels may be patterned by known methods, for example, by fine-metal masking (FMM), laser induced thermal imaging (LITI) and/or ink-jet printing (IJP) in either top emission, bottom emission or bottom emission micro cavity (see, for example, Chung et al. (2006), 70.1: Invited Paper: Large-Sized Full Color AMOLED TV: Advancements and Issues. SID Symposium Digest of Technical Papers, 37: 1958-1963. doi: 10.1889/1.2451418; Lee et al. (2009), 53.4: Development of 31-Inch Full-HD AMOLED TV Using LTPS-TFT and RGB FMM. SID Symposium Digest of Technical Papers, 40: 802-804. doi: 10.1889/1.3256911). A RGB layout may be provided.

For the plurality of OLED pixels, a common electron transport layer may be formed by the electron transport layers provided in the stack of organic layers of the plurality of OLED pixels.

The electron transport layer of the electronic device may comprise an organic electron transport matrix (ETM) material. Further, the electron transport layer may comprise one or more n-dopants. Suitable compounds for the ETM are not particularly limited. In one embodiment, the electron transport matrix compounds consist of covalently bound atoms. Preferably, the electron transport matrix compound comprises a conjugated system of at least 6, more preferably of at least 10 delocalized electrons. In one embodiment, the conjugated system of delocalized electrons may be comprised in aromatic or heteroaromatic structural moieties, as disclosed e.g. in documents EP 1 970 371 A1 or WO 2013/079217 A1.

The cathode can be made of a metal or a metal alloy with a low work function. Transparent cathodes made of a TCO are also well-known in the art.

The stack of organic layers may be made of organic compounds having a molecular weight of less than 2000 g/mol. In an alternative embodiment, the organic compounds may have a molecular weight of less than moo g/mol.

DESCRIPTION OF EMBODIMENTS

In the following, further embodiments will be described in further detail, by way of example, with reference to figures. In the FIGURES show:

FIG. 1 a schematic representation of an active OLED display, the display having a plurality of OLED pixels, FIG. 1 shows a schematic representation of an active OLED display 1 having a plurality of OLED pixels 2, 3, 4 provided in an OLED display 1. In the OLED display 1, each pixel 2, 3, 4 is provided with an anode 2a, 3a, 4a being connected to a driving circuit (not shown). Various equipment able to serve as a driving circuit for an active matrix display is known in the art. In one embodiment, the anodes 2a, 3a, 4a are made of a TCO, for example of ITO.

A cathode 6 is provided on top of an organic stack comprising an electrically doped hole transport layer (HTL) 7, an electron blocking layer (EBL) 5, a light emitting layer (EML) having sub-regions 2b, 3b, 4b assigned to the pixels 2, 3, 4 and being provided separately in an electron transport layer (ETL) 9. For example, the sub-regions 2b, 3b, 4b can provide an RGB combi nation for a color display (R—red, G—green, B—blue). By applying individual drive currents to the pixels 2, 3, 4 via the anodes 2a, 3a, 4a and the cathode 6, the display pixels 2, 3, 4 are operated independently.

SYNTHESIS EXAMPLES

Lithium Tris(4,5,6,7-tetrafluoro-3-(trifluoromethyl)-1H-indazol-1-yl)hydroborate (PB-1)

Step 1: 4,5,6,7-tetrafluoro-3-(trifluoromethyl)-1H-indazole

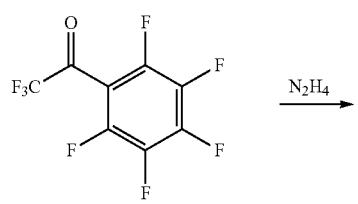

Chemical Formula: $C_8F_8O$
Molecular Weight: 264.07

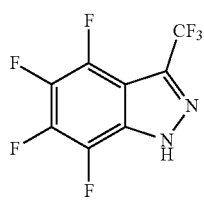

Chemical Formula: $C_8HF_7N_2$
Molecular Weight: 258.10

11.09 g (45.1 mmol) perfluoroacetophenone is dissolved in 100 mL toluene. The solution is cooled with an ice bath and 2.3 mL (2.37 g, 47.3 mmol, 1.05 eq) hydrazine-monohydrate is added dropwise. The mixture is heated to reflux for 3 days. After cooling to room temperature, the mixture is washed two times with 100 mL saturated aqueous sodium hydrogen carbonate solution and two times with 100 mL water, dried over magnesium sulfate and the solvent is removed under reduced pressure. The yellow, oily residue is distilled from bulb to bulb at a temperature about 140° C. and pressure about 12 Pa. The crude product is dissolved in hot hexane and the solution stored at −18° C. The precipitated solid is filtered off and the slurry washed two times in 10 mL hexane. 5.0 g (43%) product is obtained as a slightly yellow solid.

GCMS: confirms the expected M/z (mass/charge) ratio 258

Step 2: lithium tris(4,5,6,7-tetrafluoro-3-(trifluoromethyl)-1H-indazol-1-yl)hydroborate

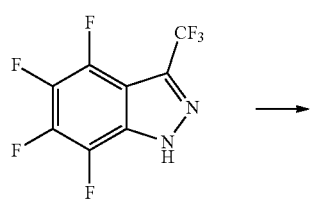

Chemical Formula: $C_8HF_7N_2$
Molecular Weight: 258.10

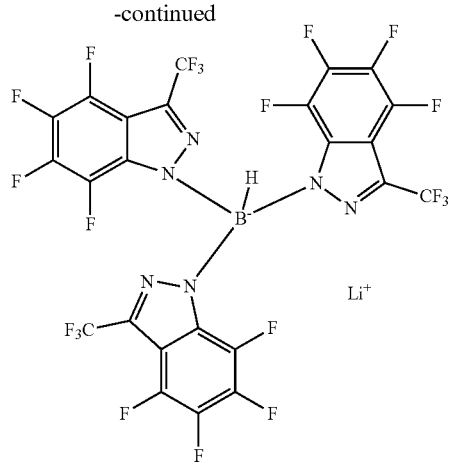

Chemical Formula: $C_{24}HBF_{21}LiN_6$
Molecular Weight: 790.03

5.1 g (19.8 mmol) 4,5,6,7-tetrafluoro-3-(trifluoromethyl)-1H-indazole is added under Ar counter-flow to an out-baked Schlenk flask and treated with 3 mL toluene. Freshly pulverized lithium borohydride is added to the starting material. The mixture is heated to 100° C., until hydrogen formed ceases (ca. 4 h). After slight cooling, 15 mL hexane are added, the mixture is heated to reflux for 10 min and cooled to room temperature. The precipitated solid is filtered off, washed with 10 mL hot hexane and dried in high vacuum. 2.55 g (49%) product is obtained as an off-white solid.

Lithium Tris(3,5-bis(trifluoromethyl)-1H-pyrazol-1-yl)hydroborate (PB-2)

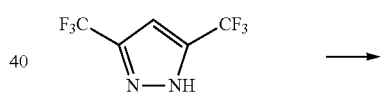

Chemical Formula $C_5H_2F_6N_2$
Molecular Weight: 204.08

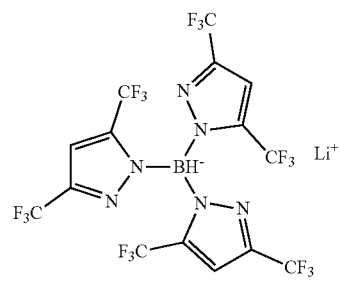

Chemical Formula $C_{15}H_4BF_{18}LiN_6$
Molecular Weight: 627.96

2.0 g (9.8 mmol, 5 eq) 3,5-bis(trifluoromethyl)pyrazole in a baked-out Schlenk flask is dissolved in 5 mL dry toluene. 43 mg (1.96 mmol, 1 eq) freshly pulverized lithium borohydride is added under Ar counter-flow and the mixture is heated to reflux for 3 days. The solvent and excess starting material are removed by distillation under reduced pressure and the residue is crystallized from n-chlorohexane. 0.25 g (20%) product is obtained as a white solid.

Lithium Tris(4,5,6,7-tetrafluoro-3-(perfluorophenyl)-1H-indazol-1-yl)hydroborate (PB-3)

Step 1: 4,5,6,7-tetrafluoro-3-(perfluorophenyl)-1H-indazole

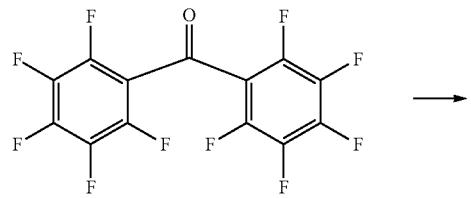

Chemical Formula: $C_{13}F_{10}O$
Molecular Weight: 362.13

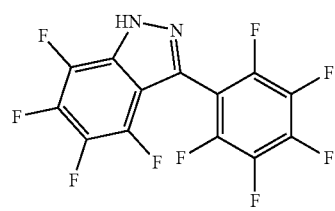

Chemical Formula: $C_{13}HF_9N_2$
Molecular Weight: 356.15

20.0 g (54.8 mmol) perfluorobenzophenone are dissolved in 200 mL toluene. 4.0 mL (4.11 g, 82.1 mmol, ca. 1.5 eq) hydrazine-monohydrate is added dropwise to the ice-cooled solution. 40 g sodium sulfate are added and the mixture is heated to reflux for 2 days. After cooling, 10 mL acetone are added to the reaction mixture and the resulting slurry is stirred for 1 h at room temperature. The solid is filtered off, thoroughly washed with 4×50 mL toluene, organic fractions are combined and washed two times with saturated aqueous sodium hydrogen carbonate. The solvent is removed under reduced pressure and the residue purified by column chromatography. 7.92 g (41%) product are obtained as a pale yellow solid.

GC-MS: confirms the expected M/z (mass/charge) ratio 356

Step 2: Lithium Tris(4,5,6,7-tetrafluoro-3-(perfluorophenyl)-1H-indazol-1-yl)hydroborate

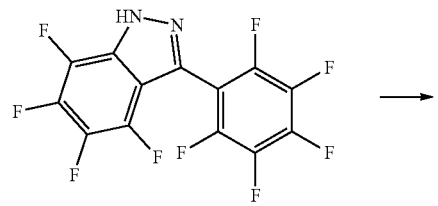

Chemical Formula: $C_{13}HF_9N_2$
Molecular Weight: 356.15

-continued

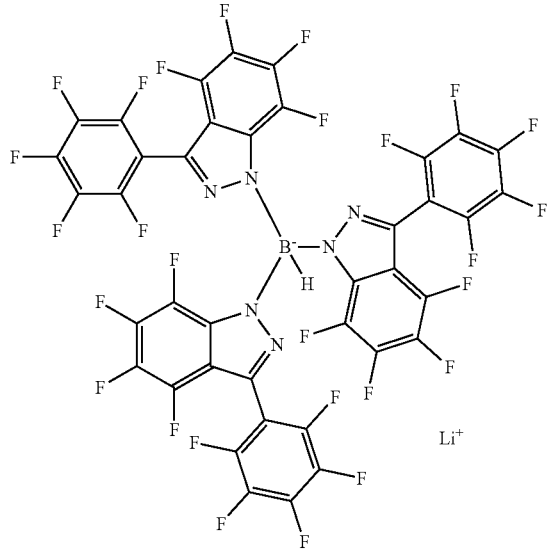

Chemical Formula: $C_{39}HBF_{27}LiN_6$
Molecular Weight: 1084.19

1.02 g (2.86 mmol, 3.0 eq) 4,5,6,7-tetrafluoro-3-(perfluorophenyl)-1H-indazole are dissolved in 5 mL chlorobenzene in a baked-out Schlenk flask. Freshly pulverized lithium borohydride (21 mg, 0.95 mmol, 1.0 eq) is added under Ar counter-flow. The mixture is heated to 150° C. for 2 days and cooled to room temperature. The solvent is removed under reduced pressure and the residue dried in high vacuum. The crude is further purified by drying in a bulb to bulb apparatus at a temperature about 150° C. and a pressure about 12 Pa. 0.57 g (70%) product is obtained as an off white solid.

Lithium Tris(3-cyano-5,6-difluoro-1H-indazol-1-yl)hydroborate (PB-4)

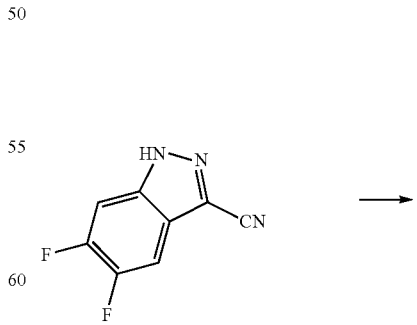

Chemical Formula $C_{13}HF_9N_2$
Molecular Weight: 356.15

-continued

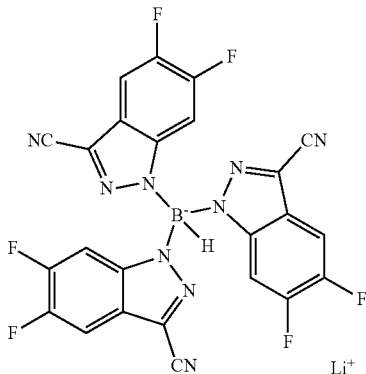

Chemical Formula C$_{24}$H$_7$BF$_6$LiN$_9$
Molecular Weight: 553.12

Freshly pulverized lithium borohydride (15 mg, 0.7 mmol, 1.0 eq) is placed in a baked-out pressure tube, 0.5 g (2.79 mmol, 4.0 eq) 5,6-difluoro-1H-indazole-3-carbonitrile are added under Ar counter-flow and washed down with 1 mL toluene. The pressure tube is closed and heated to a temperature about 160° C. for ca 21 h. After cooling to room temperature, the mixture is treated with 5 mL hexane in an ultra-sonic bath for ca 30 min. The precipitated solid is filtered off and washed with hexane (20 mL in total). After drying, 0.48 g yellowish solid is obtained.

Zinc(II) Tris(3,5-bis(trifluoromethyl)-1H-pyrazol-1-yl)hydroborate (PB-5)

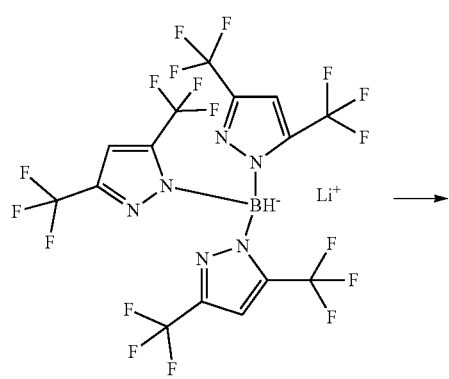

Chemical Formula C$_{15}$H$_4$BF$_{18}$LiN$_6$
Molecular Weight: 627.96

-continued

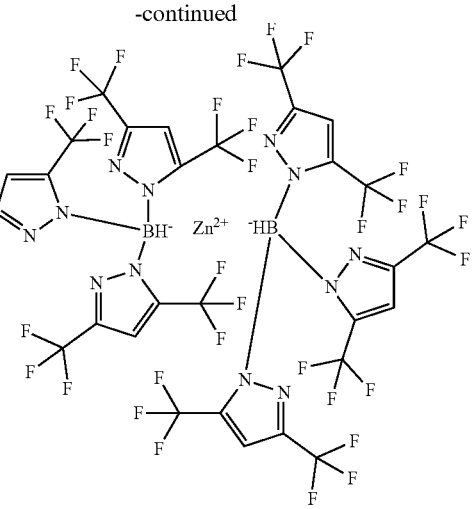

Chemical Formula C$_{30}$H$_8$B$_2$F$_{36}$N$_{12}$Zn
Molecular Weight: 1307.42

0.57 g (0.91 mmol) lithium tris(3,5-bis(trifluoromethyl)-1H-pyrazol-1-yl)hydroborate is dissolved in 6 mL N,N-dimethyl formamide. An aqueous solution of 62 mg zinc dichloride in 1 mL water is added dropwise. 20 mL water is further added and the mixture is treated in an ultra-sonic bath for 2 h. The precipitate is filtered off and dried in high vacuum. 0.485 g (82%) product is obtained as a white solid.

DEVICE EXAMPLES

Example 1 (Tandem OLED, Model for Bottom Emitting White OLED Pixel)

On a glass substrate provided with an ITO anode having thickness 90 nm, there were subsequently deposited 10 nm hole injection layer made of F1 doped with 8 wt % PD-2; 140 nm thick undoped hole transport layer made of neat F1; 20 nm thick first emitting layer formed of ABH113 doped with 3 wt % BD200 (both supplied by SFC, Korea); 25 nm thick first electron transport layer made of neat F2; 10 nm thick electron-generating part of the charge-generating layer (n-CGL) made of F3 doped with 5 wt % Yb; 2 nm thick interlayer made of F4; 30 nm thick hole-generating part of the charge-generating layer (p-CGL) made of PB-1; 10 nm thick second hole transport layer made of neat F1; 20 nm second emitting layer of the same thickness and composition as the first emitting layer; 25 nm thick first electron transport layer made of neat F2; 10 nm thick electron injection layer (EIL) made of F3 doped with 5 wt % Yb; 100 nm Al cathode.

All layers were deposited by vacuum thermal evaporation (VTE).

At the current density 10 mA/cm$^2$, the operational voltage of the device 8 V and the observed luminance were well comparable with the same device comprising a commercial state-of-art p-dopant instead of PB-1. An accurate calibration necessary for efficiency evaluation was omitted within this preliminary experiment.

Example 2 (Bottom Emitting Blue OLED Pixel)

On the same glass substrate provided with an ITO anode as in the Example 1, following layers were subsequently deposited by VTE: 10 nm hole injection layer made of the compound PB-1; 120 nm thick HTL made of neat F1; 20 nm EML made of ABH113 doped with 3 wt % NUBD370 (both supplied by SFC, Korea), 36 nm EIL/ETL made of F2 doped with 50 wt % LiQ; 100 nm Al cathode.

Comparative device comprised the HIL made of the compound CN-HAT (CAS 105598-27-4) instead of PB-1.

The inventive device achieved current density 15 mA/cm$^2$ and EQE 5.4% at a voltage 5.2 V, whereas the comparative device operated at 5.4 V with EQE 4.9%.

Example 3 (Device Comprising a Homogeneous Injection Layer Consisting of a Hole Transport Matrix Doped with a Borate Complex)

On the same glass substrate provided with an ITO anode as in the Example 2, following layers were subsequently deposited by VTE: 10 nm hole injection layer made of the matrix compound F2 doped with 8 weight 5 PB-1; 120 nm thick HTL made of neat F1; 20 nm EML made of ABH113 doped with 3 wt % NUBD370 (both supplied by SFC, Korea), 36 nm EIL/ETL made of F2 doped with 50 wt % LiQ; 100 nm Al cathode.

The inventive device achieved current density 15 mA/cm$^2$ and EQE 5.6% at a voltage 5.6 V, LT97 (operational time necessary for luminance decrease to 97% of ist initial value at the cur rent density 15 mA/cm$^2$) was 135 hours.

Example 4 (Tandem Device Comprising a Homogeneous Charge Generating Layer Consisting of a Hole Transport Matrix Doped with a Borate Complex)

In the device prepared analogously as in Example 1, the neat PB-1 layer was replaced with a layer of the same thickness, consisting of F2 doped with 35 weight % PB-1.

TABLE 1

| Compound | Structure |
|---|---|
| auxiliary materials | |
| F1 (CAS 1242056-42-3) | |
| F2 (CAS 1440545-225-1) | |

TABLE 1-continued
| | auxiliary materials |
|---|---|
| Compound | Structure |
F3
(CAS 597578-38-6)
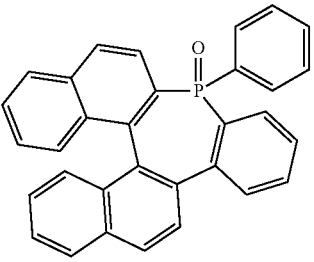 [SMILES: O=P1(c2ccccc2)c2ccccc2-c2ccc3ccccc3c2-c2c1ccc1ccccc21]
F4
(CAS 1207671-22-4)
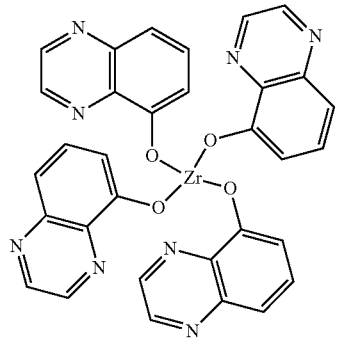
PD2
2,2',2''-(cyclopropane-1,2,3-triylidene)-tris[2-
(4-cyanoperfluorophenyl)-acetonitrile]
(CAS1224447-88-4)
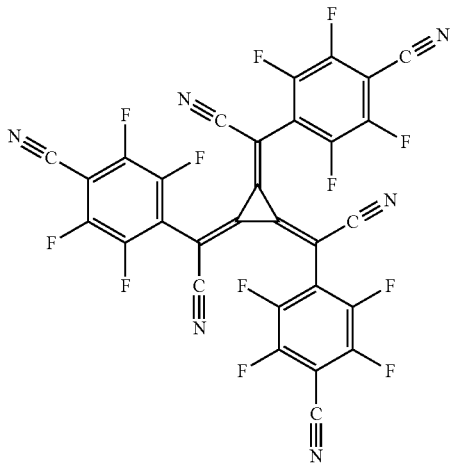 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F]
LiQ
8-Hydroxyquinolato lithium
(CAS 850918-68-2)
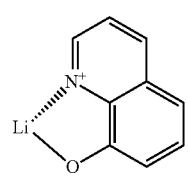

TABLE 1-continued auxiliary materials

| Compound | Structure |
| --- | --- |
| CN-HAT (CAS 105598-27-4) | (structure shown) |

The features disclosed in the foregoing description and in the dependent claims may, both separately and in any combination thereof, be material for realizing the aspects of the disclosure made in the independent claims, in diverse forms thereof.

Key Symbols and Abbreviations Used Throughout the Application:
CV cyclic voltammetry
DSC differential scanning calorimentry
EBL electron blocking layer
EIL electron injecting layer
EML emitting layer
eq. equivalent
ETL electron transport layer
ETM electron transport matrix
Fc ferrocene
Fc+ ferricenium
HBL hole blocking layer
HIL hole injecting layer
HOMO highest occupied molecular orbital
HPLC high performance liquid chromatography
HTL hole transport layer
p-HTL p-doped hole transport layer
HTM hole transport matrix
ITO indium tin oxide
LUMO lowest unoccupied molecular orbital
mol % molar percent
NMR nuclear magnetic resonance
OLED organic light emitting diode
OPV organic photovoltaics
QE quantum efficiency
$R_f$ retardation factor in TLC
RGB red-green-blue
TCO transparent conductive oxide
TFT thin film transistor
$T_g$ glass transition temperature
TLC thin layer chromatography
wt % weight percent

The invention claimed is:

1. Electronic device comprising between a first electrode and a second electrode at least one first semiconducting layer comprising
    (i) at least one first hole transport matrix compound consisting of covalently bound atoms and
    (ii) at least one electrical p-dopant selected from metal borate complexes, wherein the metal borate complex consists of at least one metal cation and at least one anionic ligand consisting of at least six covalently bound atoms which comprises at least one boron atom, wherein the first semiconducting layer is a hole injection layer, a hole-injecting part of a charge generating layer or a hole transport layer.

2. Electronic device according to claim 1, further comprising at least one light emitting layer or at least one light absorbing layer between the first electrode and the second electrode, wherein the first electrode is an anode and the first semiconducting layer is arranged between the anode and the light emitting layer or between the anode and the light absorbing layer.

3. Electronic device according to claim 2, wherein the first semiconducting layer is adjacent to the anode.

4. Electronic device according to claim 1, wherein the anionic ligand consists of at least 7 covalently bound atoms.

5. Electronic device according to claim 1, wherein the metal borate complex has formula (I)

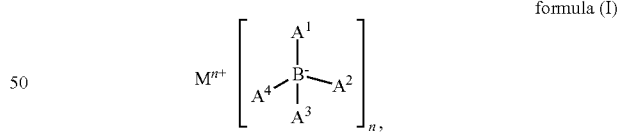

formula (I)

wherein M is a metal ion, each of $A^1$-$A^4$ is independently selected from
(i) H,
(ii) F,
(iii) CN,
(iv) $C_6$-$C_{60}$ aryl,
(v) $C_7$-$C_{60}$ arylalkyl,
(vi) $C_1$-$C_{60}$ alkyl,
(vii) $C_2$-$C_{60}$ alkenyl,
(viii) $C_2$-$C_{60}$ alkynyl,
(ix) $C_3$-$C_{60}$ cycloalkyl and
(x) $C_2$-$C_{60}$ heteroaryl;
wherein, with proviso that the overall count of carbon atoms in a carbon-containing group will not exceed 60, any hydrogen atom in any carbon containing group selected from (iv), (v), (vi), (vii), (viii), (ix) and (x) may be replaced with a substituent independently selected from F, Cl, Br, I, CN, unsubstituted or halogenated alkyl, unsubstituted or halogenated (hetero)aryl, unsubstituted or halogenated (hetero)arylalkyl, unsubstituted or halogenated alkylsulfonyl, unsubstituted or halogenated (hetero)arylsulfonyl, unsubstituted or halogenated (hetero)arylalkylsulfonyl, unsubstituted or halogenated boron-containing hydrocarbyl, unsubstituted or halogenated silicon-containing hydrocarbyl;

n is valence of the metal ion; and at least one of $A^1$-$A^4$ is F, CN, or an electron-withdrawing carbon group, wherein the electron-withdrawing carbon group is a carbon group selected from hydrocarbyl, boron-containing hydrocarbyl, silicon-containing hydrocarbyl and heteroaryl and having at least one half of its hydrogen atoms replaced with F, Cl, Br, I and/or CN.

6. Electronic device according to claim 5, wherein M is selected from alkali metals, alkaline earth metals, rare earth metals, transition metals except silver, Al, Ga, In, Tl, Sn, Pb, Bi or mixtures thereof and n is 1, 2 or 3.

7. Electronic device according to claim 1, wherein the electrical p-dopant has an energy level of its lowest unoccupied molecular orbital computed by standard quantum chemical method and expressed in absolute vacuum scale of at least 0.5 eV less negative than the energy level of the highest occupied orbital of the first hole transport compound computed by the standard quantum chemical method.

8. Electronic device according to claim 1, wherein the first hole transport matrix compound has an energy level of its highest occupied molecular orbital computed by standard quantum chemical method and expressed in absolute vacuum scale more negative than −3.0 eV.

9. Electronic device according to claim 1, wherein in the first semiconducting layer, the p-dopant and the first hole transport matrix compound form two adjacent sub-layers.

10. Electronic device according to claim 1, wherein the first hole transport matrix compound is an organic compound.

11. Electronic device according to claim 1, wherein all layers between the first and second electrode as well as the electrode deposited on top of the last organic layer are preparable by vacuum deposition at a pressure below $1\times10^{-3}$ Pa.

12. Method for preparation of the electronic device of claim 1, the method comprising at least one step wherein the first hole transport matrix compound and the electrical p-dopant are in mutual contact exposed to a temperature above 50° C.

13. Method according to claim 12, further comprising a step, wherein the p-dopant is evaporated at a reduced pressure below $1\times10^{-2}$ Pa and at a temperature above 50° C.

* * * * *